(12) United States Patent
Yi et al.

(10) Patent No.: US 7,482,532 B2
(45) Date of Patent: Jan. 27, 2009

(54) LIGHT TRAPPING IN THIN FILM SOLAR CELLS USING TEXTURED PHOTONIC CRYSTAL

(75) Inventors: Yasha Yi, Somerville, MA (US); Lionel C. Kimerling, Concord, MA (US); Xiaoman Duan, Amesbury, MA (US); Lirong Zeng, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 520 days.

(21) Appl. No.: 11/194,717

(22) Filed: Aug. 1, 2005

(65) Prior Publication Data

US 2007/0000536 A1    Jan. 4, 2007

Related U.S. Application Data

(60) Provisional application No. 60/645,766, filed on Jan. 19, 2005.

(51) Int. Cl.
*H01L 31/00* (2006.01)
(52) U.S. Cl. .................................. 136/246; 136/252
(58) Field of Classification Search .................. None
See application file for complete search history.

(56) References Cited

U.S. PATENT DOCUMENTS 5,498,883 A * 3/1996 Lebby et al. .............. 257/95

FOREIGN PATENT DOCUMENTS

WO    WO 03/001609 A2    1/2003

OTHER PUBLICATIONS

A. Seki, M. Ichikawa, N. Suganuma, Y. Tanaka, T. Koyama, and Y. Taniguchi, Organic polymer DBR laser by soft lithography II: optimization of distrubuted bragg reflector, 2003, Journal of Photopolymer Science and Technology, 16 (2), 329-334.*
Y. Yi, S. Akiyama, P. Bermel, X. Duan and L.C. Kimerling, On-chip Si-based Bragg cladding waveguide with high index contrast bilayers, Oct. 4, 2004, Optics Express, 12 (20), 4775-4780.*
Mauk et al. "Buried Metal/Dielectric/Semiconductor Reflectors for Light Trapping in Epitaxial Thin-Film Solar Cells" IEEE Conference Proceedings article, May 13, 1996, pp. 147-150.
Hiroshi et al. "Effects of Nonuniform Current Injection in GaInAsP/InP vertical-cavity lasers" Applied Physics Letters, Jun. 15, 1992, vol. 60, No. 24, pp. 2974-2976.
Exact eigenfunctions for square-wave gratings: Application to diffraction and surfact-plasmon calculations: Sheng et al.; 1982 The American Physical Society; Physical Review B; vol. 26; No. 6 pp. 29072917.
"Wavelength-selective absorption enhancement in thin-film solar cells"; 1983 American Institute of Physicss; Applied Physics Letter 43 (6), Sep. 15, 1983; pp. 579-581.

\* cited by examiner

*Primary Examiner*—Alexa D Neckel
*Assistant Examiner*—Miriam Berdichevsky
(74) *Attorney, Agent, or Firm*—Gauthier & Connors LLP

(57) ABSTRACT

A solar cell includes a photoactive region that receives light. A photonic crystal is coupled to the photoactive region, wherein the photonic crystal comprises a distributed Bragg reflector (DBR) for trapping the light.

12 Claims, 6 Drawing Sheets

| Wavelength | Bending angle (α) | Efficiency |
|---|---|---|
| 1500 nm | 70° | 73% |
| 1510 nm | 71.2° | 76% |
| 1520 nm | 72.6° | 77% |
| 1530 nm | 73.3° | 77.5% |
| 1540 nm | 75° | 76.4% |
| 1550 nm | 76.5° | 74% |
| 1560 nm | 78.2° | 70% |
| 1570 nm | 81° | 64% |
| 1580 nm | 83° | 53% |

LIGHT TRAPPING IN THIN FILM SOLAR CELLS USING TEXTURED PHOTONIC CRYSTAL

PRIORITY INFORMATION

This application claims priority from provisional application Ser. No. 60/645,766 filed Jan. 19, 2005.

This invention was made with government support under National Renewable Energy Laboratory Subcontract Number XAT-2-31605-07, awarded by the Department of Energy. The government has certain rights to the invention.

BACKGROUND OF THE INVENTION

The invention relates to the field solar cells, in particular to photonic microstructure used in conjunction with solar cells.

Photovoltaic cells, commonly known as solar cells, are well known devices that convert light energy into electricity. Solar cells provide a number of advantages when compared to conventional energy sources. For example, solar cells produce electricity without pollution and do not use the dwindling fossil fuel supply.

Silicon is one of the most popular materials for making solar cells. A silicon solar cell is conventionally created by doping the silicon to form an n-type layer and p-type layer. The n and p-type layers form a p-n junction in the silicon. When light illuminates the solar cell, some photons are able to excite electrons from their valence band to the conduction band and to produce electron/hole pairs. The electrons are swept into the n-type layer, while the holes are swept to the p-type layer. Because of the presence of the p-n junction, most of these electron/hole pairs cannot recombine, thereby leaving them to produce an electric current in an external circuit. The photons that can free electrons have a photon energy that is at least equal to and usually higher than the silicon bandgap energy.

Such arrangement is very limited in essentially using the light received for direct photovoltaic purposes.

SUMMARY OF THE INVENTION

According to one aspect of the invention, there is provided a solar cell. The solar cell includes a photoactive region that receives light. A photonic crystal is coupled to the photoactive region, wherein the photonic crystal comprises a distributed Bragg reflector (DBR) for trapping the light.

According to another aspect of the invention, there is provided a method of forming a solar cell. The method includes forming a photoactive region that receives light. A photonic crystal is formed that is coupled to the photoactive region, wherein the photonic crystal comprises a distributed Bragg reflector (DBR) for trapping the light.

BRIEF DESCRIPTION OF THE DRAWINGS

FIG. 3 is a table demonstrating the relation between the wavelength of the incident light, angle, and efficiency;

DETAILED DESCRIPTION OF THE INVENTION

The invention utilizes a photonic microstructure, in conjunction with thin silicon solar cells in order to enhance cell efficiency. The structure should increase the optical path length of wasted photons by creating anomalous refraction effects.

In order to improve thin film solar cell efficiency, the invention uses a light-trapping scheme that can tremendously enhance optical path length and make light almost completely absorbed by using novel photonic structure on the backside reflector.

The invention utilizes a photonic structure to trap light. This arrangement would allow strong light bending so that reflected light is almost in the parallel direction of the absorption layer.

Figure 1:
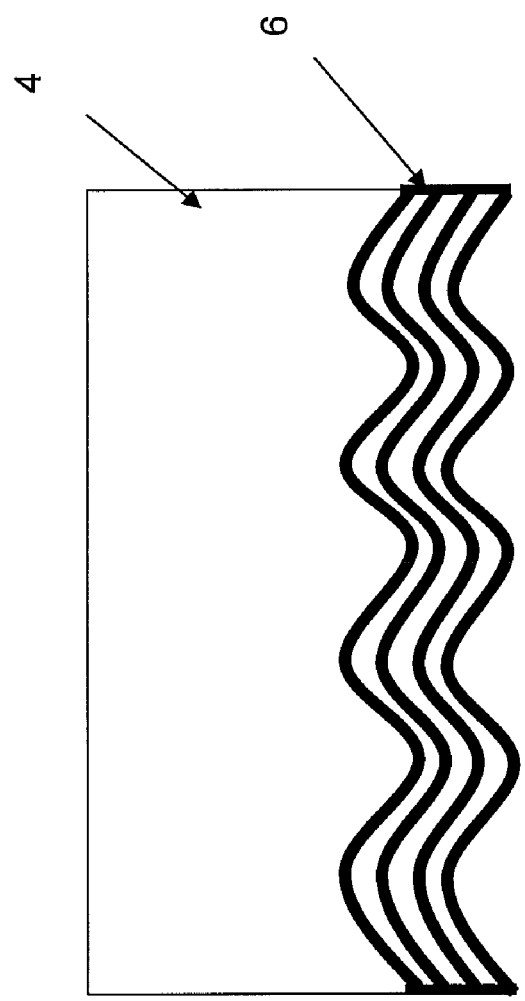
FIG. 1 is a schematic diagram illustrating a solar cell structure that includes a photonic crystal structure.

FIG. 1 illustrates a solar cell structure 2 that includes a backside reflector structure 6. Solar cell 2 is preferably a thin Si solar cell. Solar cell 2 has a photoactive region 4 with a wavered backside reflector 6 formed, for example, from wavered DBR gratings. Any incident wave in the frequency range arriving onto the backside reflector 6 will be reflected almost in the parallel direction at a large angle.

The backside reflector structure 6 is an one dimensional photonic crystal that acts as a "perfect" mirror whose reflectance can be controlled to be more than 99.96%.

Figure 2:
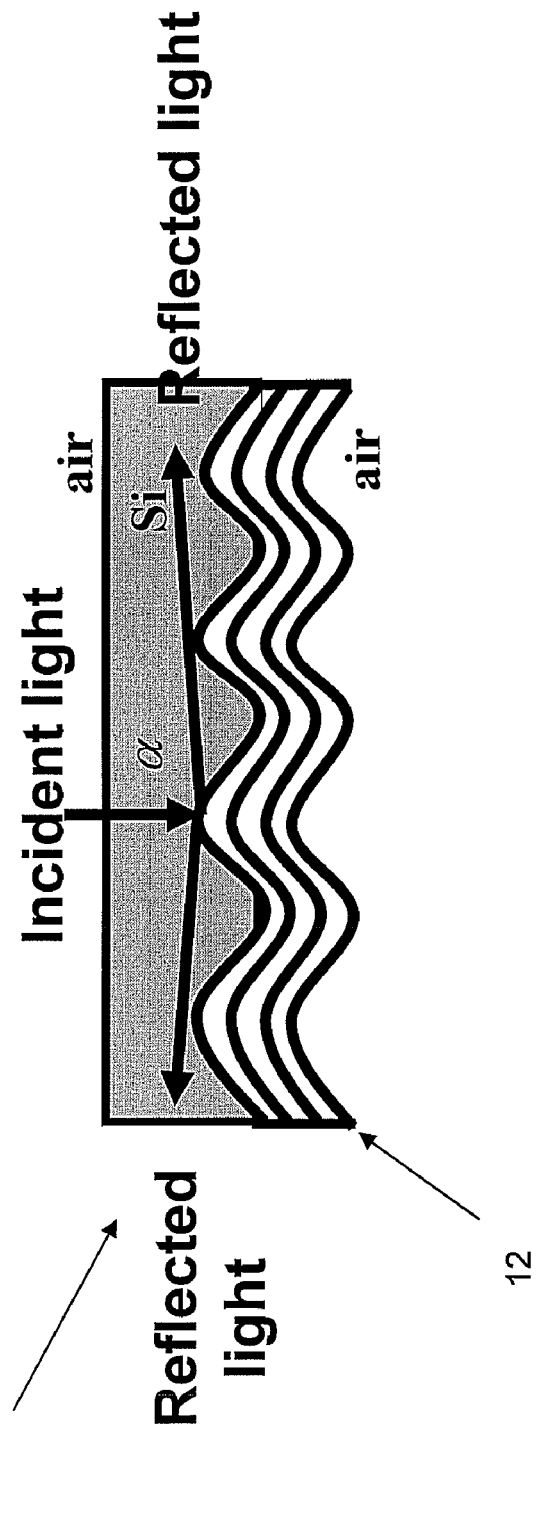
FIG. 2 is a schematic diagram illustrating a photonic structure that is used according to the invention to trap light.

FIG. 2 illustrates a wavered backside reflector structure 10 that is used according to the invention to trap light. The wavered backside reflector comprises a 1D ominidirectional photonic crystal 10 formed by wavered Si-based distributed Bragg reflector (DBR) gratings 12. Photonic crystals are periodic dielectric structures that have a photonic band gap (PBG) that forbids propagation of a certain frequency range of light.

The way the wavered backside reflector 10 works is when incident light comes into contact the structure 10 the light is reflected away at an angle α. The amount of energy that is still retained after reflection is computed is an efficiency factor. The higher the efficiency factor the better the more efficient and more energy of light is retained when reflected.

FIG. 3 illustrates a table demonstrating the relation between the wavelength of the incident light, angle, and efficiency. Note there is a gradual increase in the efficiency and angle of reflection that corresponds to the incidental wavelength. But at the incidental wavelength of 1560 nm and higher, the efficiency drops and the angle of incident also decreases.

Figure 4:
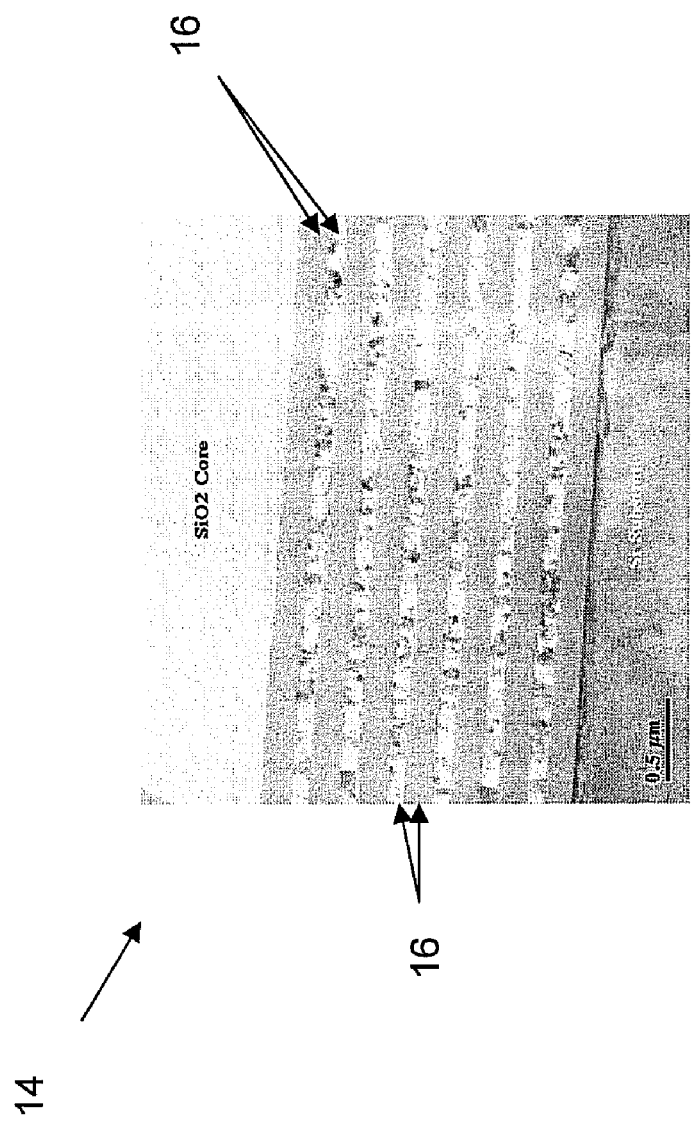
FIG. 4 is a schematic diagram illustrating an embodiment of the invention which utilizes distributed Bragg reflector (DBR) gratings to form the photonic structure.
Figure 5:
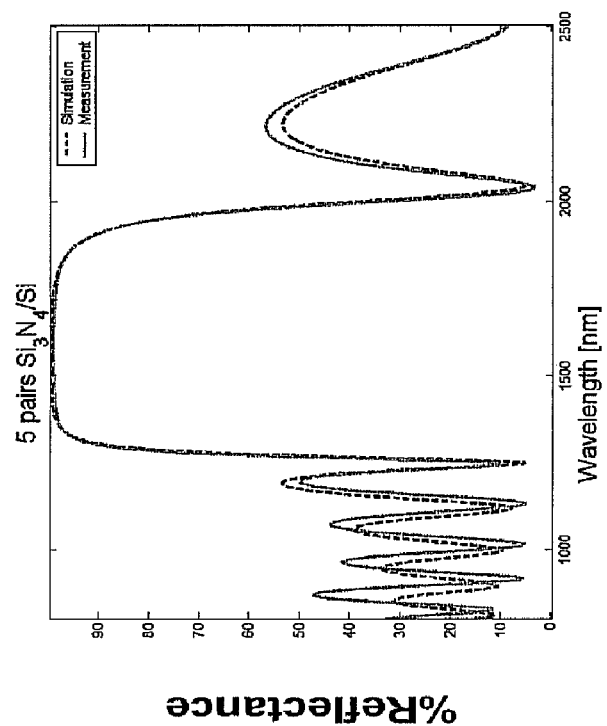
FIG. 5 is a graph illustrating the simulation and measurement of Si/Si$_3$N$_4$ DBR reflectivity.

FIG. 4 illustrates the wavered distributed Bragg reflector (DBR) gratings 14 used to form the photonic structure. The DBR used in accordance with this embodiment is a Si DBR, however other DBRs can be also be used which have similar properties as the Si DBR. In FIG. 4, the DBR grating utilizes a combination of Si/Si$_3$N$_4$ pairs 16. This arrangement produces a reflectivity of 99.6%, while a Si/SiO$_2$ pair arrangement can produce a reflectivity of 99.98%. FIG. 5 illustrates the simulation and measurement of Si/Si$_3$N$_4$ DBR reflectivity.

The inventive back reflector design combines distributed Bragg reflector (DBR) with reflection grating. It makes incident light strongly bent and reflected almost parallel to the surface of the absorption layer, hence the optical path length can be enhanced by tens of thousands of times, more than two orders of magnitude longer than that obtained by conventional light trapping schemes.

Furthermore, it provides extremely high reflectivity with large omnidirectional bandgap over several hundred nanometers in the solar spectrum range. Therefore, incident light can be almost completely absorbed. In turn, quantum efficiency of the solar cell based on the photonic structure should be improved significantly.

To maximize the open-circuit voltage of a solar cell, it is important to minimize carrier recombination, one effective way of which is to reduce film thickness. However, one needs to maintain high light absorbing capability.

The DBR grating can be developed using a practical fabrication process for Si grating DBR with current CMOS compatibility on a Si substrate. First, optical projection lithography is used to pattern substrate into gratings with period in the order of wavelength, then HBr plasma is used to accurately control etch depth. Afterwards DBR stacks are deposited using LPCVD using $Si_3N_4$: DichlorSilane ($SiCl_2H_2$) and Ammonia ($NH_3$) at 200 mTorr, 775° C. and Poly-Si: Silane ($SiH_4$) at 150-300 mTorr, 625° C. Note PECVD can also be used from fabrication.

The periodicity of the gratings is in the order of wavelength so as to be in a strong diffraction regime, which is defined as $\lambda_g/n_{Si} \approx 1.1$ μm/$n_{Si}$. The depth of the grating is defined as $\lambda/4n_{Si}$ to cancel 0th order light. The cancellation of $0^{th}$ order and +1 and −1 order is to achieve high angle bending.

Figure 6:
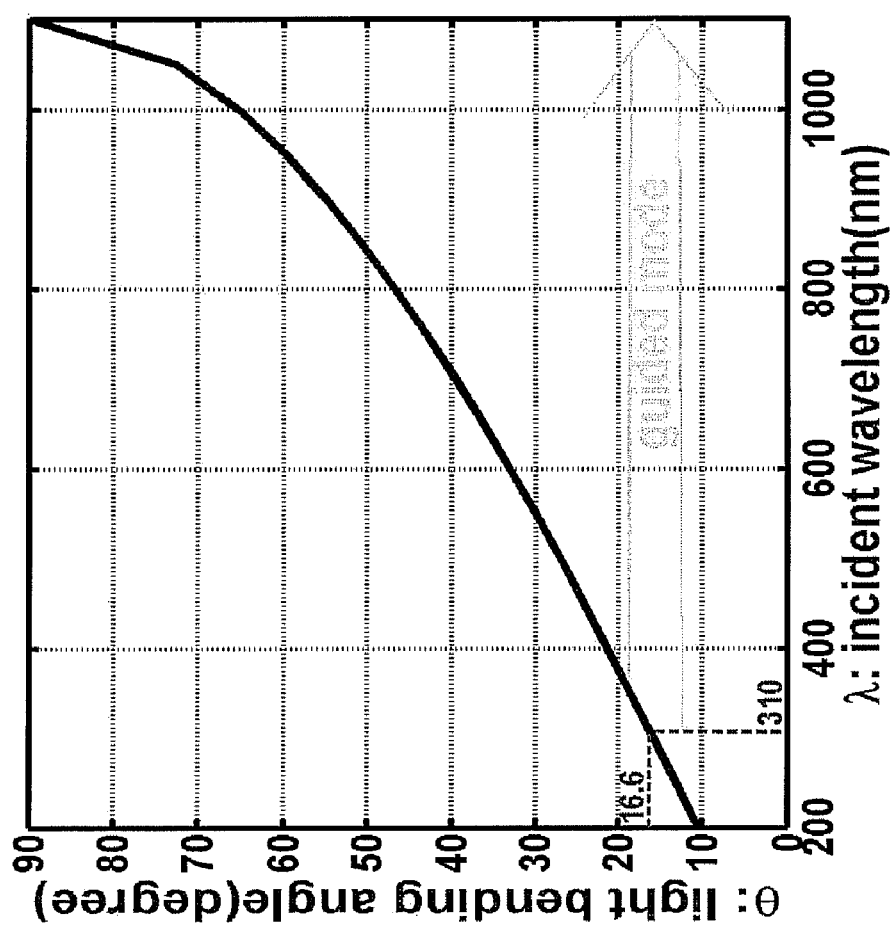
FIG. 6 is a graph illustrating the light bending characteristics of the inventive DBR gratings used the inventive backside reflector

FIG. 6 shows the light bending characteristics of the inventive DBR gratings used the inveinventive backside reflector. The graph shows light bending angle increases with wavelength. Light with λ>310 nm can be total internally reflected. Light with λ between 0.8 μm and 1.1 μm light can be bent by 47° to 90° and form a guided mode. Optical pathlength enhancement can be as large as $10^5$ times.

Although the present invention has been shown and described with respect to several preferred embodiments thereof, various changes, omissions and additions to the form and detail thereof, may be made therein, without departing from the spirit and scope of the invention.

What is claimed is:

1. A solar cell comprising:
    a photoactive region that receives light; and
    a photonic crystal that is coupled to said photoactive region, wherein said photonic crystal comprises a grating distributed Bragg reflector (DBR) for trapping said light, said DBR comprises a wavered shape so as to allow an incident wave arriving onto the photonic crystal to be reflected in a parallel direction with said photoactive region maximizing the absorption of said incident wave.

2. The solar cell of claim 1, wherein said photonic crystal comprises a grating Si DBR.

3. The solar cell of claim 1, wherein said grating Si DBR comprises a plurality of Si/$Si_3N_4$ pairs.

4. The solar cell of claim 1, wherein said grating Si DBR comprises a plurality of Si/$SiO_2$ pairs.

5. The solar cell of claim 3, wherein said Si/$Si_3N_4$ pairs produce a reflectivity of 99.6%.

6. The solar cell of claim 4, wherein said Si/$SiO_2$ pairs produce a reflectivity of 99.98%.

7. A method of forming solar cell comprising:
    forming a photoactive region that receives light; and
    forming a photonic crystal that is coupled to said photoactive region, wherein said photonic crystal comprises a distributed Bragg reflector (DBR) for trapping said light, said DBR comprises a wavered shape so as to allow an incident wave arriving onto the photonic crystal to be reflected in a parallel direction with said photoactive region maximizing the absorption of said incident wave.

8. The method of claim 7, wherein said photonic crystal comprises a grating Si DBR.

9. The method of claim 7, wherein said grating Si DBR comprises a plurality of Si/$Si_3N_4$ pairs.

10. The method of claim 7, wherein said grating Si DBR comprises a plurality of Si/$SiO_2$ pairs.

11. The method of claim 9, wherein said Si/$Si_3N_4$ pairs produce a reflectivity of 99.6%.

12. The method of claim 10, wherein said Si/$SiO_2$ pairs produce a reflectivity of 99.98%.

* * * * *